(12) United States Patent
Kok et al.

(10) Patent No.: US 8,098,870 B2
(45) Date of Patent: Jan. 17, 2012

(54) SILICON MICROPHONE

(75) Inventors: Kitt-Wai Kok, Singapore (SG); Kok Meng Ong, Singapore (SG); Kathirgamasunda Sooriakumar, Singapore (SG); Bryan Keith Patmon, Singapore (SG)

(73) Assignee: Sensfab Pte Ltd, Singapore (SG)

( * ) Notice: Subject to any disclaimer, the term of this patent is extended or adjusted under 35 U.S.C. 154(b) by 1010 days.

(21) Appl. No.: 11/914,449

(22) PCT Filed: May 15, 2006

(86) PCT No.: PCT/SG2006/000123
§ 371 (c)(1),
(2), (4) Date: Feb. 12, 2008

(87) PCT Pub. No.: WO2006/124002
PCT Pub. Date: Nov. 23, 2006

(65) Prior Publication Data
US 2008/0175417 A1 Jul. 24, 2008

(30) Foreign Application Priority Data

May 16, 2005 (SG) .............................. 200503110-9

(51) Int. Cl.
*H04R 11/04* (2006.01)
*G01L 9/00* (2006.01)
(52) U.S. Cl. ....................................... 381/355; 257/419
(58) Field of Classification Search ................... 381/345, 381/355, 423–426; 438/50–53; 257/415–419, 257/E21.613, E29.324
See application file for complete search history.

(56) References Cited

U.S. PATENT DOCUMENTS

| | | | | |
|---|---|---|---|---|
| 5,490,220 A | * | 2/1996 | Loeppert | 381/355 |
| 5,706,565 A | | 1/1998 | Sparks et al. | |
| 6,958,255 B2 | * | 10/2005 | Khuri-Yakub et al. | 438/48 |
| 7,298,856 B2 | * | 11/2007 | Tajima et al. | 381/111 |
| 2005/0101047 A1 | | 5/2005 | Freeman et al. | |

FOREIGN PATENT DOCUMENTS

| | | |
|---|---|---|
| ER | 1469701 A | 10/2004 |
| WO | WO2004/105428 | 12/2004 |

* cited by examiner

*Primary Examiner* — Calvin Lee
(74) *Attorney, Agent, or Firm* — Kilpatrick Townsend & Stockton LLP

(57) ABSTRACT

A silicon microphone comprising a backplate of electrically conductive or semi-conductive material comprising a rigid aperture area and a surrounding area, a diaphragm of electrically conductive or semi-conductive material comprising a flexible member that extends over the aperture area and a surrounding area that is at least partially connected to, and insulated from, the surrounding area of the backplate, the aperture area of the backplate and flexible member of the diaphragm forming two parallel plates of a capacitor spaced apart by a cavity, a bond pad formed on the surrounding area of the diaphragm, a bond pad formed on the surrounding area of the backplate, a channel formed in the diaphragm surrounding the bond pad formed on the surrounding area of the backplate, at least one air channel formed in the surrounding area of the diaphragm and open into the cavity between the flexible member and the aperture area of the backplate, and at least one vent through the surrounding area of the diaphragm connected to each air channel.

6 Claims, 5 Drawing Sheets

SILICON MICROPHONE

FIELD OF INVENTION

The invention relates to silicon microphones and in particular to silicon microphones with backplate chips.

BACKGROUND

A capacitive microphone typically includes a diaphragm including an electrode attached to a flexible member and a backplate parallel to the flexible member attached to another electrode. The backplate is relatively rigid and typically includes a plurality of holes to allow air to move between the backplate and the flexible member. The backplate and flexible member form the parallel plates of a capacitor. Acoustic pressure on the flexible member causes it to deflect which changes the capacitance of the capacitor. The change in capacitance is processed by electronic circuitry to provide an electrical signal that corresponds to the change.

Microelectromechanical systems (MEMS), including miniature microphones, are fabricated with techniques commonly used for making integrated circuits. Potential uses for MEMS microphones include microphones for hearing aids and mobile telephones, and pressure sensors for vehicles.

Once a silicon microphone has been fabricated it must be packaged onto a device. During this packaging process the backplate of the silicon microphone may displace or deform. Any movement of the backplate during packaging may reduce the sensitivity of the microphone or prevent operation of the microphone.

Factors that limit the performance of a silicon microphone include leakage currents between the two parallel plates of the capacitor, parasitic capacitances in the microphone, and stiction between the diaphragm and the backplate.

Leakage currents occur when the two plates of the microphone capacitor are not completely isolated from each other. Compromised isolation may occur when providing bond pads to the microphone during dicing of the wafers. Leakage currents reduce the impedance of the silicon microphone. Ideally the impedance should be infinite; however, there will always be some leakage due to microphone processing and design. In some systems the problems of leakage currents are overcome by using a charge pump in a pre-amp. The use of a pre-amp and charge pump allows the microphone to be run at a voltage greater than the desired operating voltage and is less sensitive to leakage currents.

Parasitic capacitances can be caused by debris that reside on the edge of a wafer after dicing. Parasitic capacitances are stray capacitances that are generated due to unwanted influences such as dielectric layers. These capacitances also affect the performance of the silicon microphone.

Stiction is a common problem for small capacitive devices. One area where stiction may occur is during dicing of the microphone wafer. Typically the microphone wafer is protected by placing some adhesive tape on the top side to protect the thin diaphragm. At the same time the wafer also sits on another piece of adhesive tape so that water will not enter the back side of the wafer during dicing. These two protection tapes form an enclosed air column between the top diaphragm and the bottom wafer. As the diaphragm is a thin membrane, any temperature change may expand the enclosed air column thereby pushing or pressurising the diaphragm. This pressure may cause the diaphragm to touch the backplate which is only a few microns away. After a small contact time between the backplate and the diaphragm there will be a bond formed and hence stiction has occurred.

SUMMARY OF INVENTION

It is the object of the present invention to provide a silicon microphone with a reduced stiction, leakage currents and parasitic capacitances or to at least provide the public with a useful choice.

In broad terms in one aspect the invention comprises a silicon microphone comprising a backplate of electrically conductive or semi-conductive material comprising a rigid aperture area and a surrounding area, a diaphragm of electrically conductive or semi-conductive material comprising a flexible member that extends over the aperture area and a surrounding area that is at least partially connected to, and insulated from, the surrounding area of the backplate, the aperture area of the backplate and flexible member of the diaphragm forming two parallel plates of a capacitor spaced apart by a cavity, a bond pad formed on the surrounding area of the diaphragm, a bond pad formed on the surrounding area of the backplate, a channel formed in the diaphragm surrounding the bond pad formed on the surrounding area of the backplate, at least one air channel formed in the surrounding area of the diaphragm and open into the cavity between the flexible member and the aperture area of the backplate, and at least one vent through the surrounding area of the diaphragm connected to each air channel.

Preferably the channels surround the bond pads are between 40 and 50 microns wide.

Preferably two air channels are provided.

Preferably each air channel is about 20 microns wide.

Preferably each air channel has a circuitous route.

Preferably the silicon microphone is provided with one air vent per air channel.

BRIEF DESCRIPTION OF DRAWINGS

A silicon microphone and a method of manufacturing a silicon microphone will be further described by way of example only and without intending to be limiting with reference to the following drawings, wherein.

DETAILED DESCRIPTION

The silicon microphone and method of forming a silicon microphone will be described with reference to one particular embodiment of silicon microphone. This is not intended to limit the invention. The fabrication step to reduce leakage currents, parasitic capacitance and stiction can be application to any silicon microphone.

Figure 1A:
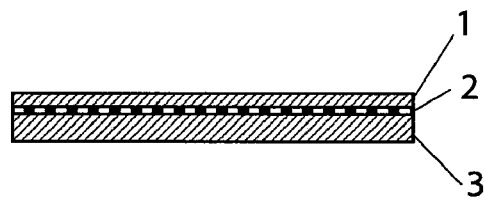
FIG. 1A is a side view of a first wafer before fabrication.

FIG. 1A is a side view of the first wafer that may be used for fabricating a diaphragm for a silicon microphone. This wafer is formed from a first layer 1 of highly doped silicon, a middle layer 2 of oxide and the third layer 3 of silicon substrate. In one embodiment the first layer is $p^{++}$ doped silicon and the third layer is an n-type substrate. In an alternative embodiment the first layer may be $n^{++}$ doped silicon and the third layer may be a p-type substrate. Typically the first layer 1 is of the order of 4 microns thick and the second layer is of the order of 2 microns thick. The thickness of these layers used in the silicon microphone will depend on the required characteristics of the microphone. The substrate layer is thicker than the other two layers and for example may be of the order of about 400 to 600 microns thick.

It should be noted that the side views shown are not drawn to scale and are given for illustrative purposes only.

In other embodiment any suitable wafer may be used.

Figure 1B:
FIG. 1B is a side view of a second wafer before fabrication.

FIG. 1B is a side view of the second wafer that may be used for fabricating a backplate for a silicon microphone. This wafer comprises a silicon wafer 4. The wafer is heavily doped silicon and may be either p-type or n-type silicon. In a preferred embodiment the wafer is <100> silicon. In other embodiments different silicon surfaces or structures may be used.

In other embodiment any suitable wafer may be used.

Figure 1C:
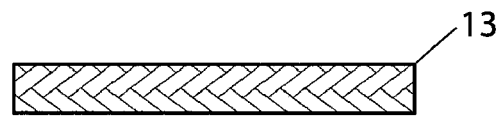
FIG. 1C is a side view of a third wafer before fabrication.

FIG. 1C is a side view of a third wafer used to provide backplate support to the silicon microphone. This wafer is preferably Pyrex or borosilicate glass but alternatively can be of any suitable material, either insulating or non-insulating.

Although FIGS. 1A, 1B and 1C are side views of the three wafers, the wafers are three dimensional with two major surfaces. The two major surfaces of the first wafer are the top and bottom surfaces (not shown in FIG. 1A). The first major surface, the top surface, comprises highly doped silicon. The second major surface, the bottom surface, comprises the silicon substrate.

In FIG. 1B the major surfaces are at the top and bottom of the wafer and both comprise the heavily doped silicon wafer.

In FIG. 1C the major surfaces are at the top and bottom of the wafer.

In fabricating the silicon microphone the three wafers are initially processed separately before being bonded together and further processed.

Figure 2A:
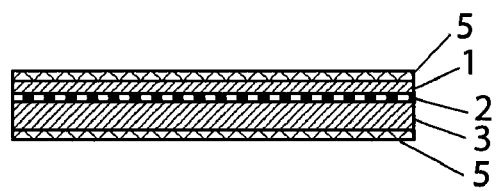
FIG. 2A is a side view of the first wafer after the deposition or growth of oxide.
Figure 2B:
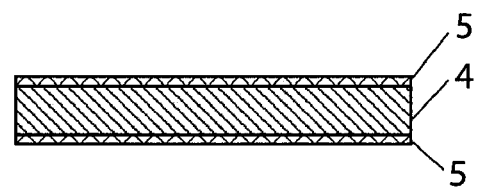
FIG. 2B is a side view of the second wafer after the deposition or growth of oxide.

FIGS. 2A and 2B show the first and second wafers after oxide 5 has been formed on the major surfaces of the wafers. Oxide is typically formed on both surfaces of both wafers through thermal growth or a deposition process. Forming oxide on both major surfaces of each wafer reduces the risks of distorting the wafer that would occur if oxide was formed on only one side of each wafer. In an alternative embodiment oxide is formed on only one major surface of each wafer. As can be seen in FIGS. 2A and 2B the thickness of the oxide layers 5 is less than the thickness of the silicon wafer.

It is to be understood that any other suitable dielectric or insulating material, for example silicon nitride, may be used in place of the oxide layer.

Figure 2C:
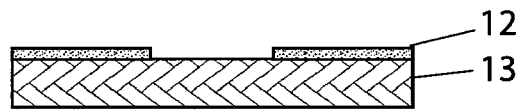
FIG. 2C is a side view of the third wafer after masking.

The third wafer must include a central aperture so that when fabrication is completed the microphone will operate correctly. If the third wafer is not provided with a central aperture one may be formed in the wafer. FIG. 2C shows the third wafer after patterning and before etching to form a central aperture. The masking layer on the wafer may be a layer of chrome. The aperture can then be formed using concentrated HF to etch into the borosilicate glass. The central aperture can be formed by wet or dry etching. If dry etching is used it may be plasma etching. In alternative embodiments the central aperture may be formed by mechanical means such as ultrasonic drilling.

Figure 2D:
FIG. 2D is a side view of the third wafer after drilling or etching.

FIG. 2D is a side view of the third wafer after formation of the aperture in the wafer. The aperture need not extend completely through the wafer but must provide a suitable back volume for the completed silicon microphone. The typical thickness of a back volume may be about 300 microns with 1 mm diameter holes. After the third wafer is prepared it is cleaned.

Figure 3:
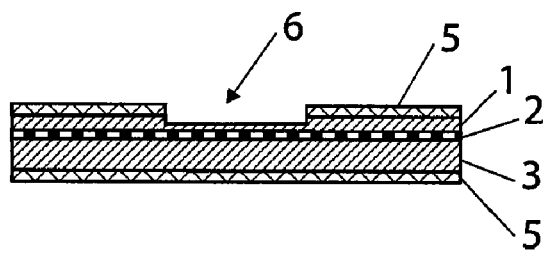
FIG. 3 is a side view of the first wafer after a cavity has been patterned and etched.

FIG. 3 shows one embodiment in which a cavity 6 is patterned and etched into the first major surface of the first wafer. In this step a portion of the heavily doped silicon layer is etched away to produce a thin section of the heavily doped portion 1. A wet or dry silicon etch may be used. The thickness of the thin section determines properties of the silicon microphone as this section will eventually form the diaphragm of the microphone. In one embodiment a reactive ion etch (RIE) is used to form the cavity. This etch is a time etch so the final thickness of the thin section of the heavily doped portion depends on the etching time.

The desired shape of the cavity is determined from the required properties of the silicon microphone.

At the same time as the cavity is etched at least one air channel may be etched in the heavily doped portion 1 of the first wafer. This air channel or air channels are formed with a circuitous route and connect into opening in the backplate or cavity area of the silicon microphone once completed. In one embodiment the circuitous route of the air channels is a zigzag route. In other embodiments any circuitous route may be used. The advantage of using a circuitous route for the air channel is that this provides a way of balancing the pressure between the front and back of the microphone to prevent or reduce stiction without reducing the acoustic sensitivity of the microphone.

In preferred embodiments two air channels are formed. The air channels may be formed in either the doped portion of the first wafer, the insulating layer(s) between the first and second wafers, or the second wafer. The air channel(s) will be connected to vents in the diaphragm face of the completed silicon microphone. The air channels will form a path between the backplate area and the diaphragm face of the silicon microphone. This path allows pressure to be equalized between the backplate area and the diaphragm which will prevent or at least reduce the occurrence of stiction between the diaphragm and backplate of the completed silicon microphone. In preferred embodiments the air channels may be etched prior to forming the insulating layer on the first wafer.

When the air channel(s) are formed in the first wafer vents may also be formed in the first wafer connecting the air channels to the other side of the wafer. If the air channels are not provided in the first wafer vent may still be formed in the first wafer at this time. In alternative embodiments vents are formed in the first wafer at the same time as the bond pad areas are etched. In preferred embodiments each air channel is provided with one vent.

In one embodiment a portion of the wafer may be etched from substrate 3 to doped portion 1*a* to allow an electrode to be formed on doped portion 1 at a later processing stage.

Figure 3A:
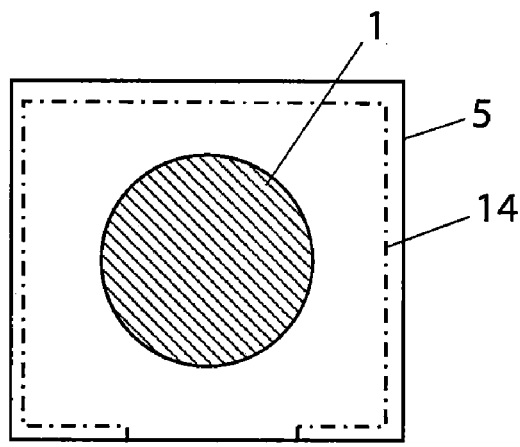
FIG. 3A is a top view of the first wafer after an isolation trench has been etched.

At the same time as wafer cavity is patterned and etched an isolation trench 14 is patterned and etched in to the first major surface of the first wafer as shown in FIG. 3A. The isolation trench may also be provided around area 15 which is etched for a later bond pad to be added. The isolation trench reduces parasitic capacitances by isolating the diaphragm layer from the edges of the silicon microphone so that any debris that reside on the edge of the microphone after dicing will not have any electrical influence on the microphone performance. The isolation trench will be typically 40 to 50 microns wide.

Figure 4:
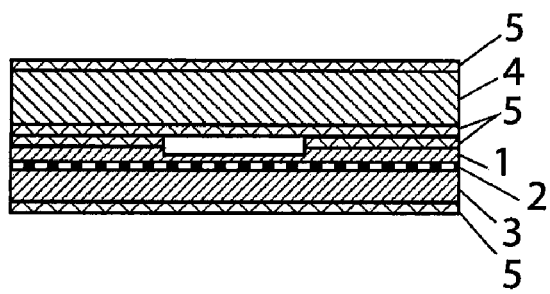
FIG. 4 is a side view of the two wafers bonded together.

As shown in FIG. 4 the first and second wafers are bonded together. The major surfaces bonded together are the first major surface 1 of the first wafer and one of the major surfaces of the second wafer 4. In a preferred embodiment the two wafers are bonded together using fusion bonding. As shown in FIG. 4 it is the oxide layer 5 of second wafer 4 and the patterned oxide layer 5 of the first wafer that are bonded together.

Figure 5:
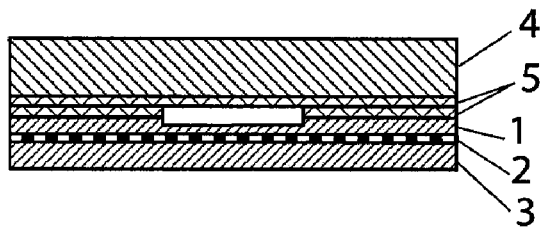
FIG. 5 is a side view of the two wafers after the oxide layers have been stripped.

FIG. 5 shows the first and second wafers after the oxide layers are stripped from the exposed major surfaces of these wafers. Oxide stripping is well known and any suitable technique may be used to strip the oxide from the exposed surfaces.

Figure 6:
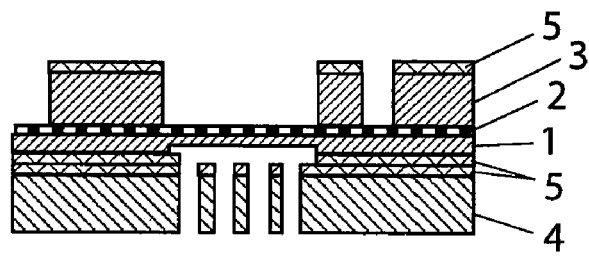
FIG. 6 is a side view of a second embodiment of silicon microphone without electrodes.

FIG. 6 shows the first and second wafers after selective etching of the first wafer to provide areas to which bond pads can be attached.

Acoustic holes are patterned and etched into the second wafer as shown in FIG. 6. Acoustic holes may be etched into the second wafer using any suitable method. In one embodiment to pattern and etch the acoustic holes the first step is to form a layer of oxide 7 on the outer major surface of the second wafer 4. The oxide is then covered with a layer of resist and the resist is then patterned. Etching is performed to etch the acoustic holes through the oxide 7 and silicon 4. The etching may also etch the oxide layer 5 at the bottom of the acoustic holes to provide access between the acoustic holes and the cavity formed in the heavily doped silicon layer 1 of the first wafer.

The metal may be a combination of chromium and gold or any other suitable metal or metal combination, for example titanium or aluminium. In one embodiment the metal 7 is patterned and etched to include corner anchor pads by which the microphone may be attached to an underlying carrier.

As can be seen in FIG. 6 areas 14 have been etched to allow for bond pads to be formed on the diaphragm and backplate surfaces of the silicon microphone. If the vents in the first wafer to the air channels have not yet been etched they may be etched during this step.

The acoustic holes or apertures in the silicon wafer may be circular and set within a rectangle of the silicon wafer with its centre at the centre of the silicon wafer stack but with length and breadth less than that of the wafer stack. The shape and arrangement of the apertures is chosen to provide suitable acoustic performance from the microphone.

During the etching of the acoustic holes a small area or gap around the perimeter of the silicon microphone may also be etched (not shown). In the preferred embodiment this etching is performed by a reactive ion etch-lag (RIE-lag). The RIE-lag is a phenomenon by which, in this case, the smaller dimensioned perimeter gap in the resist mask etches to a lesser depth than the larger dimensioned acoustic holes. Because of the RIE-lag, the gap about the perimeter of the silicon microphone does not completely etch through the silicon layer 4. The incompletely etched perimeter provides lines of weakness where the bonded wafer will break when stressed, i.e. when subjected to pressure by a roller. Forming this incomplete etch allows dicing of the wafer, into individual microphone chips, without the use of abrasives or wet processes thereby reducing possible damage to the fragile diaphragm. The partial etch should be sufficiently deep to allow easy breakage of the wafer at dicing but shallow enough to allow easy handling of the wafer without breakage before dicing.

Figure 6A:
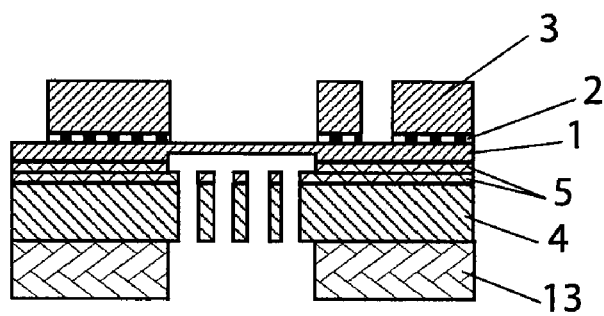
FIG. 6A is a side view of the device of FIG. 6 after the addition of the third wafer.

FIG. 6A shows the silicon microphone of FIG. 6 after bonding the third wafer to the second major surface of the second wafer and etching through the insulator layer from one portion of the first wafer. In the preferred embodiment the third wafer is anodically bonded to the second wafer. The third wafer may be bonded to the second wafer before or after the diaphragm has been etched. If the third wafer is of a non-insulating material an insulating layer is bonded to the second wafer and the third wafer is bonded to the insulating layer.

Figure 6B:
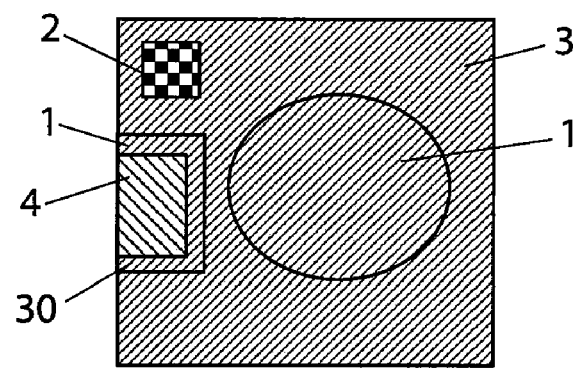
FIG. 6B is a top view of the device of FIG. 6.

FIG. 6B is a top view of the silicon microphone of FIG. 6. Wafer 3 forms the main part of the top view of the microphone. Diaphragm 1 can be seen through the aperture in wafer 3. As can be seen at the side an aperture has been formed into which a bond pad to the back plate of the microphone will be formed. To reduce leakage currents a barrier 30 and isolation trench are formed around the area in which the bond pad is formed. The barrier is formed in the insulator layer and in some of the layers of the first wafer. The isolation trench separates the middle pad from the wafer 3. The isolation trench is etched together with the diaphragm. Typical dimensions of the isolation trench are between about 30 and 50 microns. Any metal sputtered on the barrier while forming the bond pads will be isolated by the isolation trench from the diaphragm and hence no leakage will occur between the centre bond pad and the wafer 3.

The barrier 30 acts as a sacrificial wall in preventing any metal from crossing over to the wafer 3. A further advantage of the barrier is to prevent any metal spilling over to the diaphragm and wafer 3 during dicing. As dicing is a physical process some metal from the centre pad may be attached to the dicing blade and thereby deposited onto wafer 3 near the bond pad area. This deposited metal can cause shorting of wafer 3.

The barrier 30 and isolation trench can also be formed in the silicon microphone when layer 3 is etched away as shown in FIGS. 6, 6A, 7 and 7A.

Figure 7:
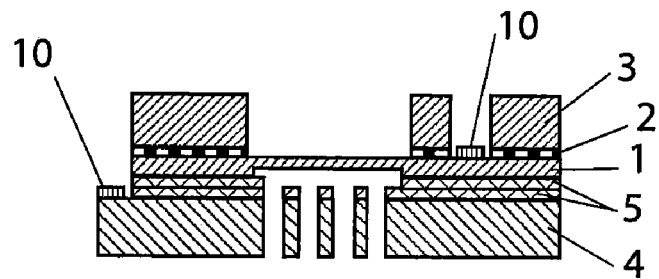
FIG. 7 is a side view of the microphone of FIG. 6 with electrodes.
Figure 7A:
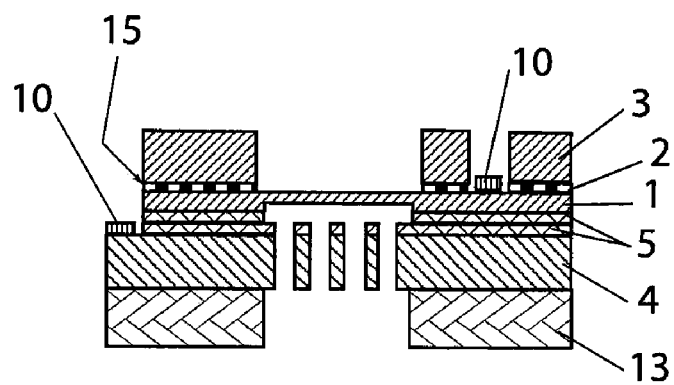
FIG. 7A is a side view of the microphone of FIG. 7 with the addition of the third wafer.
Figure 7B:
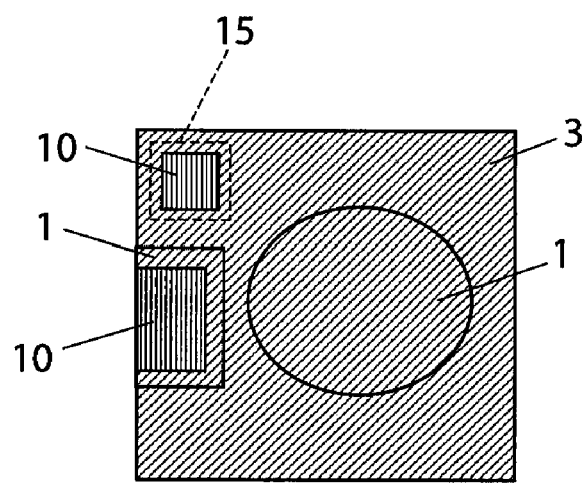
FIG. 7B is a top view of the microphone of FIG. 7.

FIG. 7B shows a top view of the silicon microphone after the bond pads 10 have been formed on the silicon microphone.

It should be noted that the shape of the diaphragm aperture in the top view of the microphone and the shape and position of the bond pads are not meant to be limiting. These are shown as examples only.

FIG. 7A shows the silicon microphone of FIG. 7 after bonding the third wafer to the second major surface of the second wafer. In the preferred embodiment the third wafer is anodically bonded to the second wafer. The third wafer may be bonded to the second wafer before or after electrodes have been formed on the first wafer. If the third wafer is of a non-insulating material an insulating layer is bonded to the second wafer and the third wafer is bonded to the insulating layer.

In another alternative embodiment substrate 3 is thinned to oxide layer 2 or to highly doped silicon layer 1 before bonding the wafers together as shown in FIG. 4.

In yet another alternative embodiment substrate 3 is thinned to a predetermined thickness either before or after bonding the wafers together. Substrate 3 can then be selectively patterned and etched.

In yet another alternative embodiment one or both of the wafers may be at the final wafer thickness before processing the wafers.

In any of these embodiments the third wafer can be bonded to the second wafer at any stage after the acoustic holes have been formed in the backplate.

Figure 8:
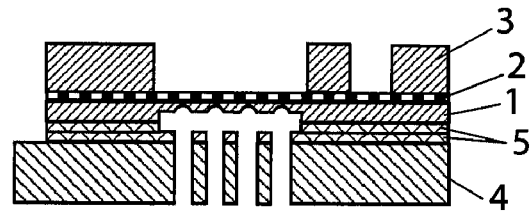
FIG. 8 is a side view of a silicon microphone with corrugations in the diaphragm.

FIG. 8 shows an alternative embodiment of silicon microphone of the invention. In this embodiment the diaphragm of the silicon microphone is over-etched to form a series of corrugations in the diaphragm. An advantage of corrugations is that it improves the strength of the silicon microphone. It should be noted that the silicon microphone of FIG. 8 is not complete and does not show any electrodes. Forming corrugations in the diaphragm can be combined with any other embodiment of silicon microphone of the invention. For example the corrugations may be combined with the microphones of FIG. 7 or 10.

Figure 8A:
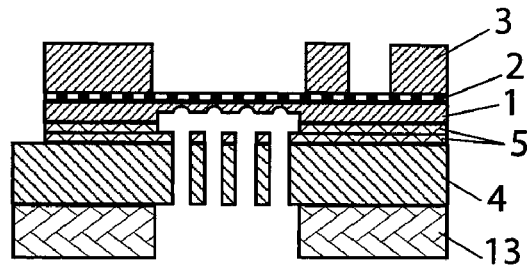
FIG. 8A is a side view of the silicon microphone of FIG. 8 with the addition of the third wafer.

FIG. 8A shows the silicon microphone of FIG. 8 after bonding the third wafer to the second major surface of the second wafer. In the preferred embodiment the third wafer is anodically bonded to the second wafer. The third wafer may be bonded to the second wafer at before or after the corrugations are formed in the diaphragm. If the third wafer is of a non-insulating material an insulating layer is bonded to the second wafer and the third wafer is bonded to the insulating layer.

Figure 9:
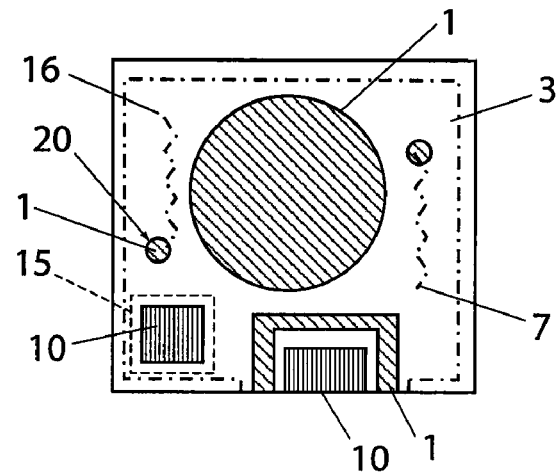
FIG. 9 is a top view of a microphone with addition to equalise the pressure within the microphone and reduce leakage current.

FIG. 9 is a top view of a silicon microphone including improvements to equalise the pressure between the diaphragm cavity and the back of the microphone to reduce the incidence of stiction. As previously described stiction occurs when wet processes are used or when there is a pressure difference between the diaphragm cavity and the air space around the back plate of the microphone. Stiction can occur when dicing microphones as each side is covered by adhesive tape for protection. Stiction can also occur when packaging microphones. A microphone is attached to a substrate using die attach material that must be cured. During curing the die attach material will emit by-product gasses or moisture that can cause stiction between the diaphragm and back plate.

To reduce the incidence of stiction channels are formed layer 1 that are open to the back plate area. These channels 16 are connected to air vents that open onto the top of the silicon microphone and equalise the pressure between the backplate and the front of the microphone. In preferred embodiments channels 16 are formed in a zigzag shape. To reduce the loss of sensitivity caused by the vents and channels the channels must have a high air resistance. The greater the product of the channel air resistance the less the loss of sensitivity. In preferred embodiments the channels are of the order of 20 microns thick.

Figure 10:
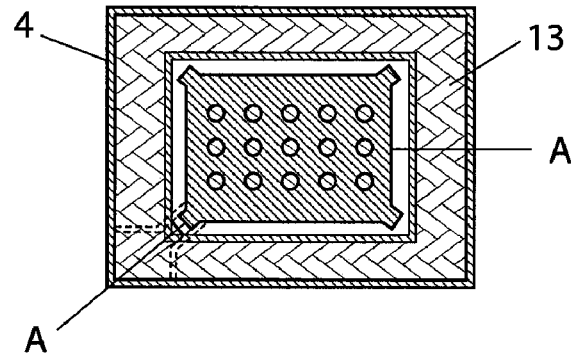
FIG. 10 is a bottom view of the completed silicon microphone.

FIG. 10 shows the perforated silicon layer and the backplate support 13. The advantage of providing a backplate support on the silicon microphone is that it reduces or prevents movement of the backplate when the silicon microphone is packaged thus providing a more robust silicon microphone. The backplate support provides strength to the backplate. The advantages of using a backplate support of insulating material include enabling designs where the backplate 4 and diaphragm are separated which reduces parasitic capacitance. Backplate support 13 also increases the back volume of the silicon microphone formed by the holes in the second wafer. FIG. 10 shows the outline of silicon 4 that forms the acoustic holes. As can be seen in FIG. 10 in this embodiment channels are formed in silicon 4 so that the section of silicon containing the acoustic holes is anchored to the silicon microphone in one corner. Stabilisation of the silicon layer 4 containing the acoustic holes is needed to prevent unwanted movement of the silicon layer 4 within the silicon microphone. This stabilisation is provided by backplate support 13.

The foregoing describes the invention including preferred forms thereof. Alterations and modifications as will be obvious to those skilled in the art are intended to be incorporated in the scope hereof as defined by the accompanying claims.

The invention claimed is:

1. A silicon microphone comprising
    a backplate of electrically conductive or semi-conductive material comprising a rigid aperture area and a surrounding area,
    a diaphragm of electrically conductive or semi-conductive material comprising a flexible member that extends over the aperture area and a surrounding area that is at least partially connected to, and insulated from, the surrounding area of the backplate,
    the aperture area of the backplate and flexible member of the diaphragm forming two parallel plates of a capacitor spaced apart by a cavity,
    a bond pad formed on the surrounding area of the diaphragm,
    a bond pad formed on the surrounding area of the backplate,
    an isolation trench formed in the diaphragm surrounding the bond pad formed on the surrounding area of the backplate, at least one air channel formed in the surrounding area of the diaphragm and open into the cavity between the flexible member and the aperture area of the backplate, and
    at least one vent through the surrounding area of the diaphragm connected to each air channel.

2. A silicon microphone as claimed in claim 1 wherein the isolation trench surrounding the bond pads is between 40 and 50 microns wide.

3. A silicon microphone as claimed in claim 1 wherein two air channels are provided.

4. A silicon microphone as claimed in claim 1 wherein each air channel is about 20 microns wide.

5. A silicon microphone as claimed in claim 1 wherein each air channel has a circuitous route.

6. A silicon microphone as claimed in claim 1 wherein the silicon microphone is provided with one air vent per air channel.

* * * * *